United States Patent
Shiraishi

(10) Patent No.: US 9,071,258 B1
(45) Date of Patent: Jun. 30, 2015

(54) PARALLEL-SERIAL CONVERTER CIRCUIT

(71) Applicant: KABUSHIKI KAISHA TOSHIBA, Tokyo (JP)

(72) Inventor: Mikio Shiraishi, Yokohama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/481,794

(22) Filed: Sep. 9, 2014

(30) Foreign Application Priority Data

Jan. 16, 2014 (JP) .................................. 2014-005858

(51) Int. Cl.
   *H03M 9/00* (2006.01)
(52) U.S. Cl.
   CPC ....................................... *H03M 9/00* (2013.01)
(58) Field of Classification Search
   CPC ....................................................... H03M 9/00
   USPC ........................... 341/100–101; 375/355, 374
   See application file for complete search history.

(56) References Cited

U.S. PATENT DOCUMENTS

| 5,808,571 | A | 9/1998 | Kuwata et al. | |
|---|---|---|---|---|
| 6,335,696 | B1 * | 1/2002 | Aoyagi et al. | 341/100 |
| 7,848,318 | B2 * | 12/2010 | Nguyen et al. | 370/366 |
| 7,990,294 | B2 * | 8/2011 | Doi et al. | 341/101 |
| 8,169,347 | B2 | 5/2012 | Tsunoda | |
| 8,289,196 | B2 * | 10/2012 | Tsunoda | 341/101 |
| 8,593,313 | B2 | 11/2013 | Koyanagi | |
| 8,817,929 | B2 * | 8/2014 | Shimomura | 375/354 |
| 2012/0033748 | A1 | 2/2012 | Shimomura | |

* cited by examiner

*Primary Examiner* — Khai M Nguyen
(74) *Attorney, Agent, or Firm* — Patterson & Sheridan, LLP

(57) ABSTRACT

A parallel-serial converter circuit has a frequency divider configured to generate a frequency-divided signal by dividing a frequency of a reference clock signal by a dividing ratio depending on a logic of a speed control signal, a timing pulse generator configured to generate a timing pulse signal based on the frequency-divided signal, a load signal generator configured to generate a load signal based on the speed control signal and the timing pulse signal, a bit clock generator configured to generate a bit clock signal based on the speed control signal and the timing pulse signal, and a parallel-serial converter configured to newly load the parallel data in synchronization with the load signal and convert the loaded parallel data into serial data in synchronization with the bit clock signal.

20 Claims, 10 Drawing Sheets

| TRANSFER SPEED CONTROL CODE c0, c1 | TRANSFER SPEED |
| --- | --- |
| 00 | PAUSE (STOP TRANSFER) |
| 01 | FIRST TRANSFER SPEED (x BITS PER SECOND) |
| 10 | SECOND TRANSFER SPEED (2x BITS PER SECOND) |

FIG.2

3:10 BIT PISO 6,7: FIRST AND SECOND 4-BIT PISO

5:TIMING PULSE GENERATOR

12:COMPARISON CIRCUIT

PARALLEL-SERIAL CONVERTER CIRCUIT

CROSS REFERENCE TO RELATED APPLICATIONS

This application is based upon and claims the benefit of priority from the prior Japanese Patent Application No. 2014-5858, filed on Jan. 16, 2014, the entire contents of which are incorporated herein by reference.

FIELD

Embodiments of the present invention relate to a parallel-serial converter circuit.

BACKGROUND

In a high-capacity recording device such as SSD (Solid State Disk) and HDD (Hard Disk Drive), it is general that parallel data read from a recording region is converted into serial data before being transmitted. Accordingly, the high-capacity recording device has a parallel-serial converter circuit.

As a measure for improving data transfer speed, a plurality of types of parallel data may be simultaneously converted into serial data to transmit these serial data in synchronization with each other. In this case, a plurality of parallel-serial converters are provided in the parallel-serial converter circuit. In such a parallel-serial converter circuit, it is general to start parallel-serial conversion after supplying a reset signal to each parallel-serial converter to reset each parallel-serial converter, to synchronize the parallel-serial converters and eliminate a timing gap therebetween.

However, since the reset signal is used also in the components other than the parallel-serial converter circuit, the reset signal path to be routed often becomes long. Accordingly, the load capacity of the reset signal becomes large, which lengthens the rise time of the reset signal. Further, the rise time of the reset signal differs depending on each parallel-serial converter in the same chip, due to the influence of manufacturing process, power-supply voltage, junction temperature, etc. It is difficult to predict this difference to make a design for restraining the timing gap in the reset signal.

Each parallel-serial converter performs parallel-serial conversion based on a clock signal obtained by dividing the frequency of a reference high-speed clock signal by a frequency divider. It is not easy to design the timing considering a time gap after the rising edge of the reset signal is detected before the frequency divider starts its operation. In particular, the design is made more difficult as the speed of the parallel-serial conversion increases.

As stated above, when a plurality of parallel-serial converters are provided in the parallel-serial converter circuit, it is difficult to synchronize the parallel-serial converters for the above reasons even if each parallel-serial converter is a circuit capable of operating at high speed, which leads to a problem that data transfer speed cannot be increased so much.

BRIEF DESCRIPTION OF THE DRAWINGS

FIG. 2 is a diagram showing an example of the correspondence relationship between a transfer speed control code c0/c1 and data transfer speed.

DETAILED DESCRIPTION

Figure 1:
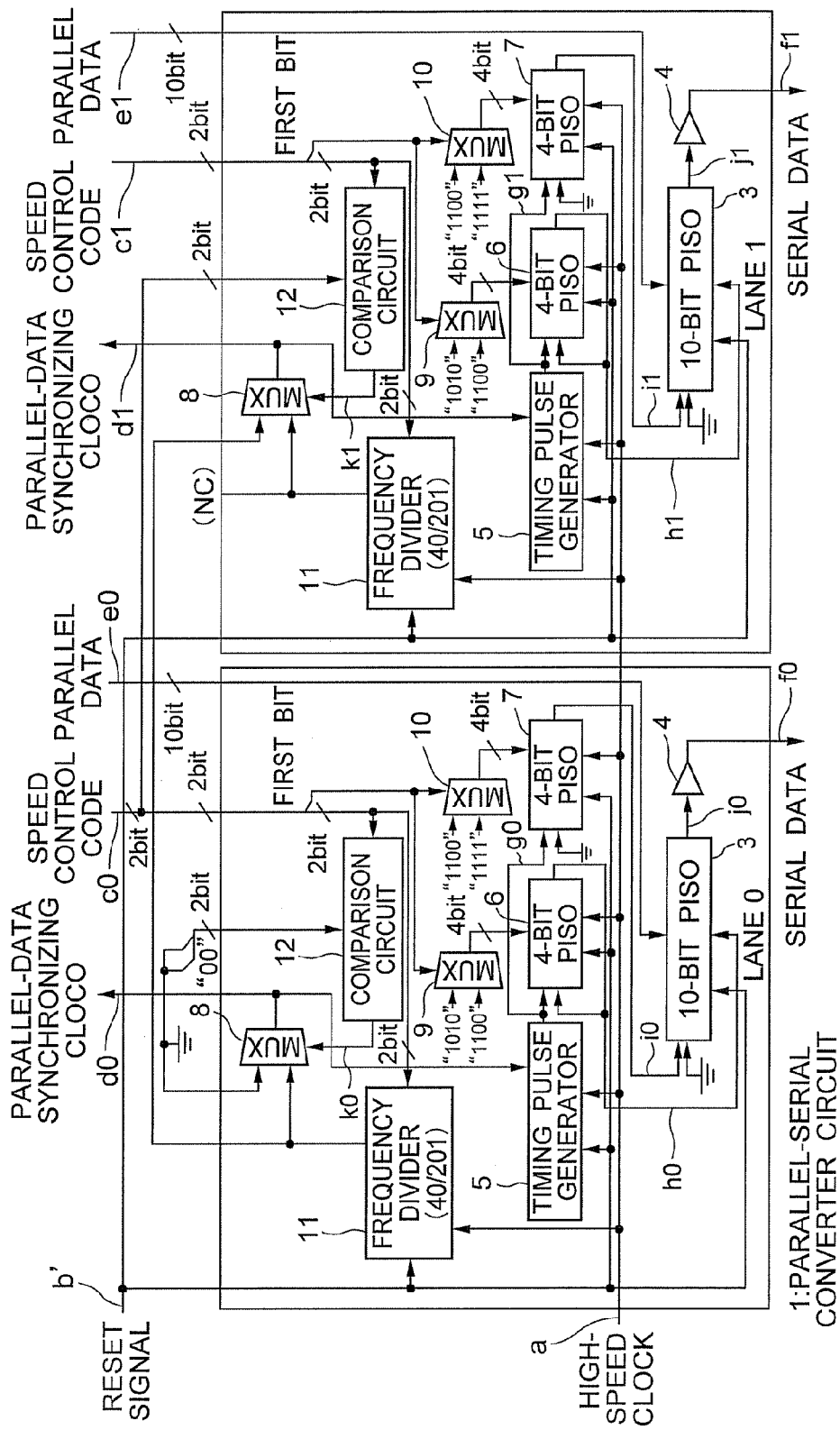
FIG. 1 is a block diagram showing the internal configuration of a parallel-serial converter circuit 1 according to an embodiment.

Hereinafter, embodiments of the present invention will be explained referring to the drawings.

A parallel-serial converter circuit has:

a frequency divider configured to generate a frequency-divided signal by dividing a frequency of a reference clock signal by a dividing ratio depending on a logic of a speed control signal;

a timing pulse generator configured to generate a timing pulse signal based on the frequency-divided signal;

a load signal generator configured to generate a load signal based on the speed control signal and the timing pulse signal;

a bit clock generator configured to generate a bit clock signal based on the speed control signal and the timing pulse signal; and a parallel-serial converter configured to newly load the parallel data in synchronization with the load signal and convert the loaded parallel data into serial data in synchronization with the bit clock signal.

In the following embodiments, characteristic configuration and operation in a parallel-serial converter circuit will be mainly explained, but the configuration and operation in the parallel-serial converter circuit should not be limited to the following explanation. Note that configuration and operation omitted from the following explanation are also included in the embodiments of the present invention.

FIG. 1 is a block diagram showing the internal configuration of a parallel-serial converter circuit 1 according to an embodiment of the present invention. The parallel-serial converter circuit 1 of FIG. 1 has two signal transmitters 2. In the present embodiment, these two signal transmitters 2 are referred to as Lane 0 and Lane 1. Lane 0 is a master lane, and Lane 1 is a slave lane. Lanes 0 and 1 use transfer speed control codes (speed control signals) c0 and c1 respectively to set data transfer speed (bit rate).

FIG. 2 is a diagram showing an example of the correspondence relationship between the transfer speed control code c0/c1 and data transfer speed. When the transfer speed control code c0/c1 is "00", data transfer is stopped. When the transfer speed control code c0/c1 is "01", data is transferred at a first transfer speed (x bits per second). When the transfer speed control code c0/c1 is "10", data is transferred at a second transfer speed (2× bits per second). Note that FIG. 2 shows merely an example, and the correspondence relationship between the transfer speed control code c0/c1 and data transfer speed may be arbitrarily set. Further, the number of bits of the transfer speed control code c0/c1 should not be limited to two. The number of bits of the transfer speed control code and the data transfer speed may be set depending on the number of lanes.

The signal transmitters 2 of Lanes 0 and 1 have a lot in common in the internal configuration thereof. The internal configuration of Lane 0 will be explained first, and then the internal configuration of Lane 1 will be explained focusing on the differences from Lane 0.

As shown in FIG. 1, the signal transmitter 2 of Lane 0 has a 10-bit parallel-serial converter (10-bit PISO) 3, a buffer 4, a timing pulse generator 5, two 4-bit parallel-serial converters (hereinafter referred to as a first 4-bit PISO 6 and a second 4-bit PISO 7), three multiplexers (hereinafter referred to as a first MUX 8, a second MUX 9, and a third MUX 10), a frequency divider 11, and a comparison circuit 12.

The 10-bit PISO 3 converts 10-bit parallel data e0 into serial data j0 in synchronization with a bit clock signal h0. The serial data j0 is inputted into the buffer 4, and final serial data f0 is outputted from the buffer 4.

The comparison circuit 12 (master comparator) compares the transfer speed control code c0 with "00", and outputs the comparison result. The frequency divider 11 generates a frequency-divided signal by dividing the frequency of a high-speed clock signal (reference clock signal) "a" by a dividing ratio depending on the logic of the transfer speed control code c0. More concretely, the frequency divider 11 switches the dividing ratio depending on the value of the transfer speed control code c0, and generates a frequency-divided signal by dividing the frequency of the high-speed clock signal a by the selected dividing ratio. For example, when the transfer speed control code c0 has a value of "01" as a binary code, the frequency divider 11 selects "40" as the dividing ratio, and when the transfer speed control code c0 has a value of "10" as a binary code, the frequency divider 11 selects "20" as the dividing ratio.

The first MUX 8 (master frequency-divided signal selector) selects either the frequency-divided signal or a low-level fixed signal, based on the comparison result of the comparison circuit 12. More concretely, the first MUX 8 selects the frequency-divided signal when the comparison circuit 12 detects a mismatch, and selects the low-level fixed signal when the comparison circuit 12 detects a match.

The output signal from the first MUX 8 is used as a parallel data synchronous clock signal d0 to load the parallel data e0 from the outside. When the comparison circuit 12 detects a mismatch, the parallel data e0 is loaded in synchronization with the frequency-divided signal. Further, when the comparison circuit 12 detects a match, the parallel data synchronous clock signal d0 is set to the low-level fixed signal, and thus the parallel data e0 is not loaded.

The timing pulse generator 5 generates a timing pulse signal g0 based on the frequency-divided signal. More concretely, when the first MUX 8 selects the frequency-divided signal, the timing pulse generator 5 generates the timing pulse signal g0 depending on the cycle of the frequency-divided signal.

The second MUX 9 selects one from a plurality of first reference bit strings based on the transfer speed control code c0 and sets the selected second reference bit string as a first initial value. More concretely, the second MUX 9 selects an initial value to be set for the first 4-bit PISO 6, based on the logic of the most significant bit (first bit) of the transfer speed control code c0. For example, the second MUX 9 selects "1100" as the initial value when the most significant bit is "0", and selects "1010" as the initial value when the most significant bit is "1".

The first 4-bit PISO 6 (first shift register) generates the bit clock signal h0 by shifting the bits of the first initial value in synchronization with the high-speed clock signal "a", using the timing pulse signal g0 as a trigger. More concretely, the first 4-bit PISO 6 generates the bit clock signal h0 by shifting the bits of the initial value selected by the second MUX 9 in synchronization with the high-speed clock signal "a", using the input of the timing pulse signal g0 as a trigger. The output signal from the first 4-bit PISO 6 is not only supplied to the 10-bit PISO 3 but also fed back to the first stage of the first 4-bit PISO 6, which means that the bit pattern of the initial value 0011 or 0101 selected by the second MUX 9 is repeatedly outputted. In this way, the bit clock signal h0 is generated.

The second 4-bit PISO 7 (second shift register) generates a load signal by shifting the bits of the second initial value in synchronization with the high-speed clock signal "a", using the timing pulse signal g0 as a trigger. More concretely, the second 4-bit PISO 7 shifts the bits of the initial value selected by the third MUX 10 in synchronization with the high-speed clock signal "a", using the input of the timing pulse signal g0 as a trigger. The output signal from the second 4-bit PISO 7 serves as the load signal for the 10-bit PISO 3.

Each time the timing pulse signal g0 is inputted, the first 4-bit PISO 6 and the second 4-bit PISO 7 are inputted with the initial values from the second MUX 9 and the third MUX 10 respectively, and restart the bit shift operation. Thus, the first 4-bit PISO 6 and the second 4-bit PISO 7 repeatedly generate the bit clock signal h0 and the load signal i0 respectively in synchronization with the cycle of the timing pulse signal g0.

The signal transmitter 2 of Lane 1 is similar to the signal transmitter 2 of Lane 0 in its circuit configuration, but is partially different in its configuration and operation.

The transfer speed control code c1 instead of the transfer speed control code c0 is inputted to Lane 1, and parallel data e1 to be inputted to Lane 1 is different from parallel data e0 to be inputted to Lane 0.

Further, parallel data synchronizing clock d1 and serial data f1 outputted from Lane 1 are different from parallel data synchronizing clock d0 and serial data f0 outputted from Lane 0. Hereinafter, the internal configuration of Lane 1 will be explained focusing on the differences other than the above differences.

The comparison circuit 12 (slave comparator) of Lane 1 compares the transfer speed control codes c0 and c1, and outputs a signal indicating the comparison result.

A first MUX (slave frequency-divided signal selector) 8 of Lane 1 selects and outputs, based on the output signal from the comparison circuit 12, either the frequency-divided signal outputted from the frequency divider 11 of Lane 1 or the frequency-divided signal outputted from the frequency divider 11 of Lane 0. More concretely, the first MUX 8 of Lane 1 selects the frequency-divided signal outputted from the frequency dividing circuit 11 of Lane 0 when the transfer speed control codes c0 and c1 match each other, and selects the frequency-divided signal outputted from the frequency dividing circuit 11 of Lane 1 when the transfer speed control codes c0 and c1 do not match each other.

Aside from the above differences and partial differences in the types of signals to be inputted/outputted, the signal transmitters 2 of Lane 0 and Lane 1 are the same in their configuration and operation.

Note that Lane 0 corresponds to a master signal transmitter, and Lane 1 corresponds to a slave signal transmitter. In Lane 0, the frequency divider 11 corresponds to a first frequency divider, the timing pulse generator 5 corresponds to a first timing pulse generator, the first 4-bit PISO 6 corresponds to a first bit clock generator and the first shift register, the second 4-bit PISO 7 corresponds to a first load signal generator and a third shift register, the 10-bit PISO 3 corresponds to a first parallel-serial converter, the second MUX 9 corresponds to a first selector, and the third MUX 10 corresponds to the third selector. In Lane 1, the frequency divider 11 corresponds to a second frequency divider, the timing pulse generator 5 corresponds to a second timing pulse generator, the first 4-bit PISO 6 corresponds to a second bit clock generator and the second shift register, the second 4-bit PISO 7 corresponds to a second load signal generator and a fourth shift register, the 10-bit PISO 3 corresponds to a second parallel-serial converter, the second MUX 9 corresponds to a second selector, and the third MUX 10 corresponds to the fourth selector.

Figure 3:
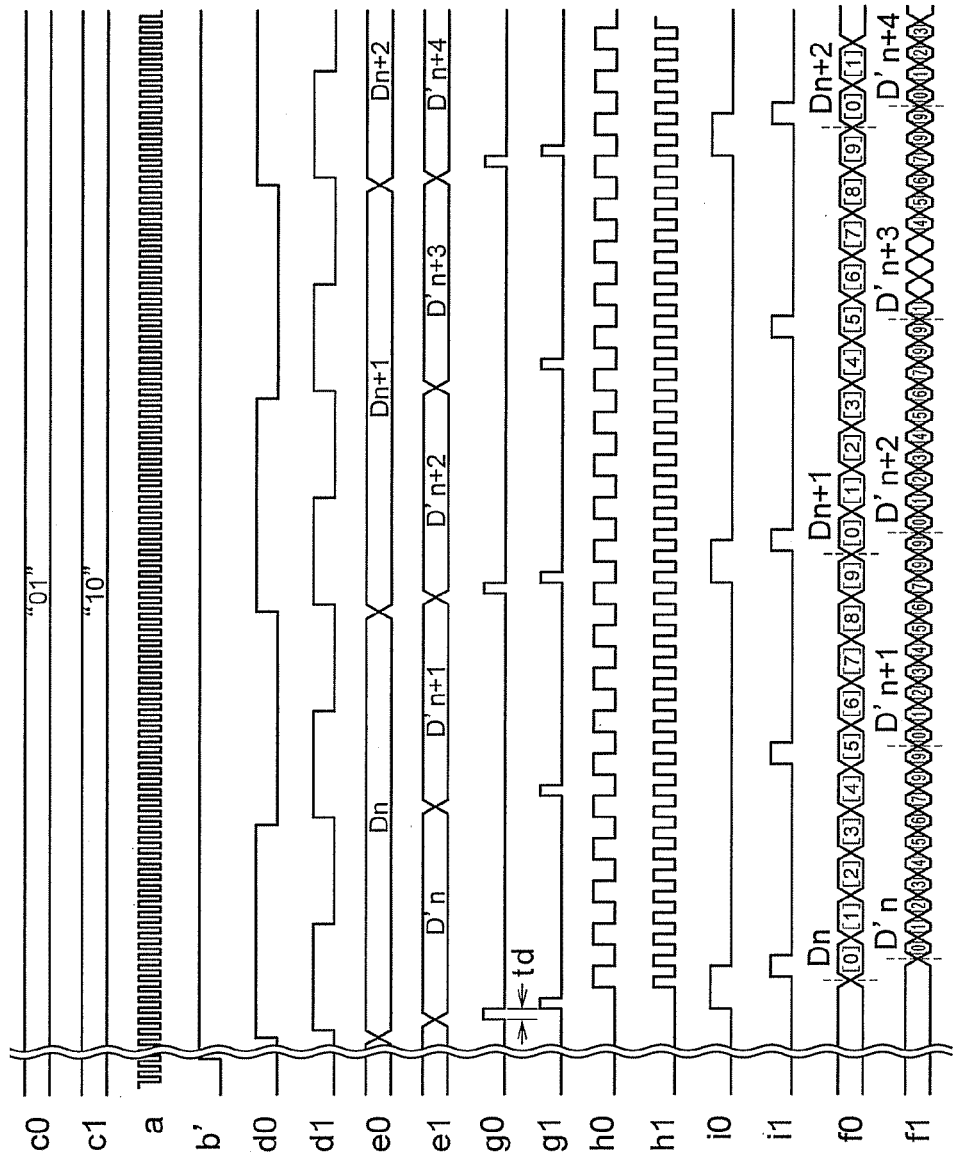
FIG. 3 is a timing diagram of the parallel-serial converter circuit 1 of FIG. 1.
Figure 4:
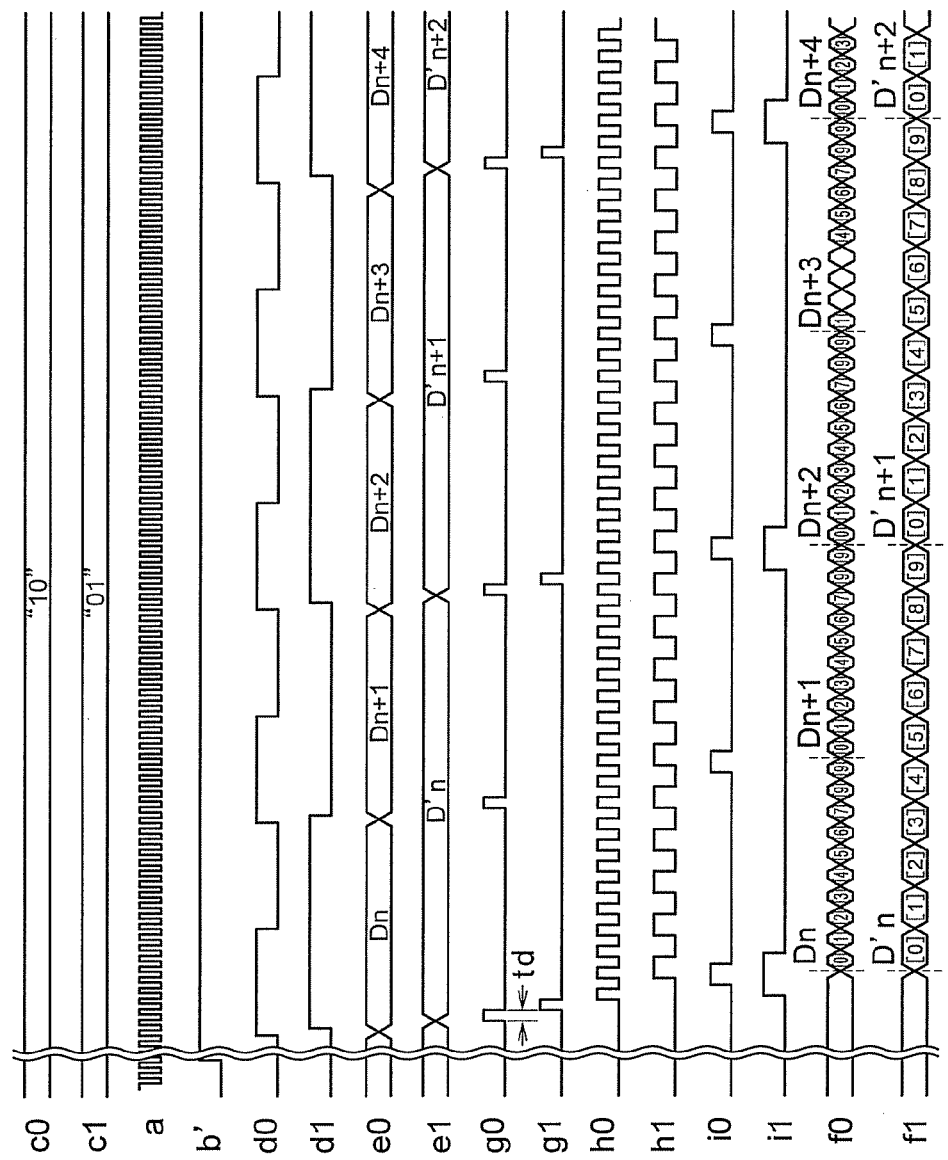
FIG. 4 is a timing diagram of the parallel-serial converter circuit 1 of FIG. 1.
Figure 5:
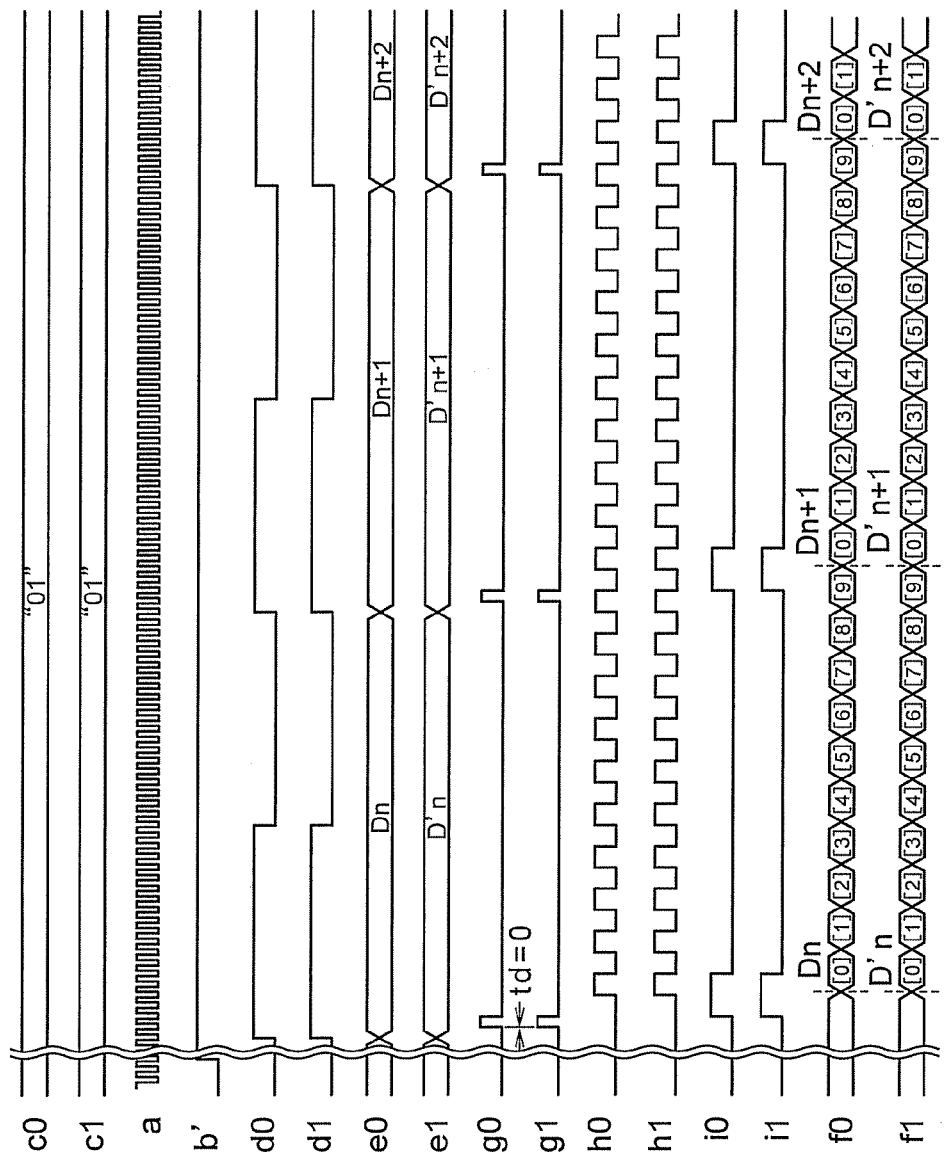
FIG. 5 is a timing diagram of the parallel-serial converter circuit 1 of FIG. 1.

Each of FIGS. 3 to 6 is a timing diagram of the parallel-serial converter circuit 1 of FIG. 1. FIG. 3 and FIG. 4 are different from each other in the values of the transfer speed control codes c0 and c1 inputted into the signal transmitters 2 of Lanes 0 and 1 respectively. In FIG. 3, c0="01" and c1="10", while in FIG. 4, c0="10" and c1="01". On the other hand, in FIG. 5 and FIG. 6, the values of the transfer speed control codes c0 and c1 inputted into the signal transmitters 2 of Lanes 0 and 1 respectively are the same. In FIG. 5, c0=c1=01 is used as an example, while in FIG. 6, c0=c1=10 is used as an example.

In the case of FIG. 3, where c0=01 and c1=10, the bit rate of Lane 1 is twice the bit rate of Lane 0 as shown in FIG. 2.

When a reset signal becomes High, the frequency divider 11 of each of Lanes 0 and 1 outputs a frequency-divided signal. Since the most significant bit of the transfer speed control code c0 is "0", the frequency divider 11 of Lane 0 outputs a frequency-divided signal obtained by dividing the frequency of the high-speed clock signal "a" by "40". Since the transfer speed control codes c0 and c1 are different from each other, the comparison circuit 12 of Lane 0 outputs a mismatch signal, and the first MUX 8 of Lane 0 selects the frequency-divided signal outputted from the frequency divider 11 and outputs this frequency-divided signal as the parallel data synchronous clock signal d0.

Similarly, since the most significant bit of the transfer speed control code c1 in Lane 1 is "1", the frequency divider 11 of Lane 1 outputs a frequency-divided signal obtained by dividing the high-speed clock signal "a" by "20". The comparison circuit 12 of Lane 1 also outputs a mismatch signal, and the first MUX 8 of Lane 1 selects the frequency-divided signal outputted from the frequency divider 11 and outputs this frequency-divided signal as the parallel data synchronous clock signal d1.

The parallel data synchronous clock signals d0 and d1 are outputted to the outside of the parallel-serial converter circuit 1, and also inputted into the timing pulse generators 5 respectively.

The timing pulse generators 5 generates the timing pulse signals g0 and g1 which become High for a predetermined period at the rising edges of the parallel data synchronous clock signals d0 and d1.

The signal transmitters 2 of Lanes 0 and 1 do not operate in complete synchronization with each other due to manufacturing variability and signal delay due to wire routing etc. As shown in FIG. 3, the timing pulse signals of Lanes 0 and 1 may be outputted at different timings with a gap td therebetween.

Since the most significant bit of the transfer speed control code c0 is "0", the second MUX 9 of Lane 0 selects the initial value "1100" and supplies it to the first 4-bit PISO 6. The first 4-bit PISO 6 of Lane 0 loads the initial value "1100" using the timing pulse signal g0 as a trigger, and performs bit shift operation. Since the output signal from the first 4-bit PISO 6 is fed back to an input terminal SI, the first 4-bit PISO 6 of Lane 0 repeatedly outputs "1100" as the bit clock signal h0. This bit clock signal h0 is used as a bit shift clock for the 10-bit PISO 3 of Lane 0.

Similarly, since the most significant bit of the transfer speed control code c1 is "1", the second MUX 9 of Lane 1 selects the initial value "1010" and supplies it to the first 4-bit PISO 6. The first 4-bit PISO 6 of Lane 1 loads the initial value 1010 using the timing pulse signal g1 as a trigger, and performs bit shift operation. Since the output signal from the first 4-bit PISO 6 is fed back to the input terminal SI, the first 4-bit PISO 6 of Lane 1 repeatedly outputs "1010" as a bit clock signal h1. This bit clock signal h1 is used as a bit shift clock for the 10-bit PISO 3 of Lane 1.

Since the most significant bit of the transfer speed control code c0 is "0", the third MUX 10 of Lane 0 selects an initial value "1111" and supplies it to the second 4-bit PISO 7. The second 4-bit PISO 7 of Lane 0 loads the initial value "1111" using the timing pulse signal g0 as a trigger, and performs bit shift operation. The signal outputted from the second 4-bit PISO 7 of Lane 0 is inputted into the 10-bit PISO 3 of Lane 0 as the load signal i0.

Since the most significant bit of the transfer speed control code c1 is "1", the third MUX 10 of Lane 1 selects the initial value "1100" and supplies it to the second 4-bit PISO 7. The second 4-bit PISO 7 of Lane 1 loads the initial value "1100" using the timing pulse signal g1 as a trigger, and performs bit shift operation. The signal outputted from the second 4-bit PISO 7 of Lane 1 is inputted into the 10-bit PISO 3 of Lane 1 as a load signal i1.

The 10-bit PISO 3 of Lane 0 loads the parallel data e0 at the rising edge of the load signal i0, and outputs the serial data j0 obtained by shifting the bits of the parallel data e0 in synchronization with the bit clock signal h0.

The 10-bit PISO 3 of Lane 1 loads the parallel data e1 at the rising edge of the load signal i1, and outputs serial data j1 obtained by shifting the bits of the parallel data e1 in synchronization with the bit clock signal h1.

In the case of FIG. 3, the speed of the bit clock signal h1 is twice the speed of the bit clock signal h0, which means that the serial data j1 is outputted at twice the speed of the serial data j0.

In the case of FIG. 4, the transfer speed control code c0=10 in Lane 0, and the transfer speed control code c1=01 in Lane 1. Accordingly, the dividing ratios selected by the frequency dividers 11, the initial values selected by the second MUXs 9, and the initial values selected by the third MUX 10 in the respective lanes are reversed compared to FIG. 3. As a result, the bit clock h0 of Lane 0 has a frequency twice that of the bit clock h1 of Lane 1, and the serial data f0 of Lane 0 has a frequency twice that of the serial data f1 of Lane 1.

In the case of FIG. 5, the transfer speed control code c0 is "01", and thus the signal transmitter 2 of Lane 0 operates similarly to FIG. 3. Since the transfer speed control code c1 is also "01", the comparison circuit 12 of Lane 1 outputs a match signal. Accordingly, the first MUX 8 of Lane 1 selects the frequency-divided signal outputted from the frequency divider 11 of Lane 0, and outputs this frequency-divided signal to the outside while supplying it also to the timing pulse generator 5, as the parallel data synchronous clock signal d1.

As stated above, in the case of FIG. 5, the timing pulse generators 5 of Lanes 0 and 1 generate the timing pulse signals g0 and g1 in synchronization with the same frequency-divided signal. Thus, no timing gap is generated between the timing pulse signals g0 and g1 of Lanes 0 and 1.

Further, the second MUX 9 and third MUX 10 in Lane 0 select the same initial values as those selected by the second MUX 9 and third MUX 10 in Lane 1. Thus, the first 4-bit PISOs 6 generate the bit clock signals h0 and h1 having the same timing, and the second 4-bit PISOs 7 generate the load signals i0 and i1 having the same timing.

Accordingly, the serial data j0 and j1 generated by the 10-bit PISOs 3 have the same timing, and the serial data f0 and f1 outputted through the buffers 4 have the same timing.

As stated above, when the transfer speed control codes c0 and c1 are the same, the timing gap between the serial data f0 and f1 to be finally obtained can be eliminated. When the reset signal is used to synchronize a plurality of lanes as in a conventional manner, a timing gap is easily caused between the lanes due to a large load capacity of the reset signal path, as stated above. In the present embodiment, when the transfer speed control codes c0 and c1 match each other, the frequency-divided signal of the master lane (Lane 0) is used also in the slave lane (Lane 1), which makes it possible to synchronize the timings of the timing pulse signals g0 and g1 of the master lane and slave lane. This makes it possible to synchronize not only the timings of the load signals i0 and i1 but also the timings of the bit clock signals h0 and h1, which prevents a timing gap between the serial data f0 and f1 to be finally obtained.

Figure 6:
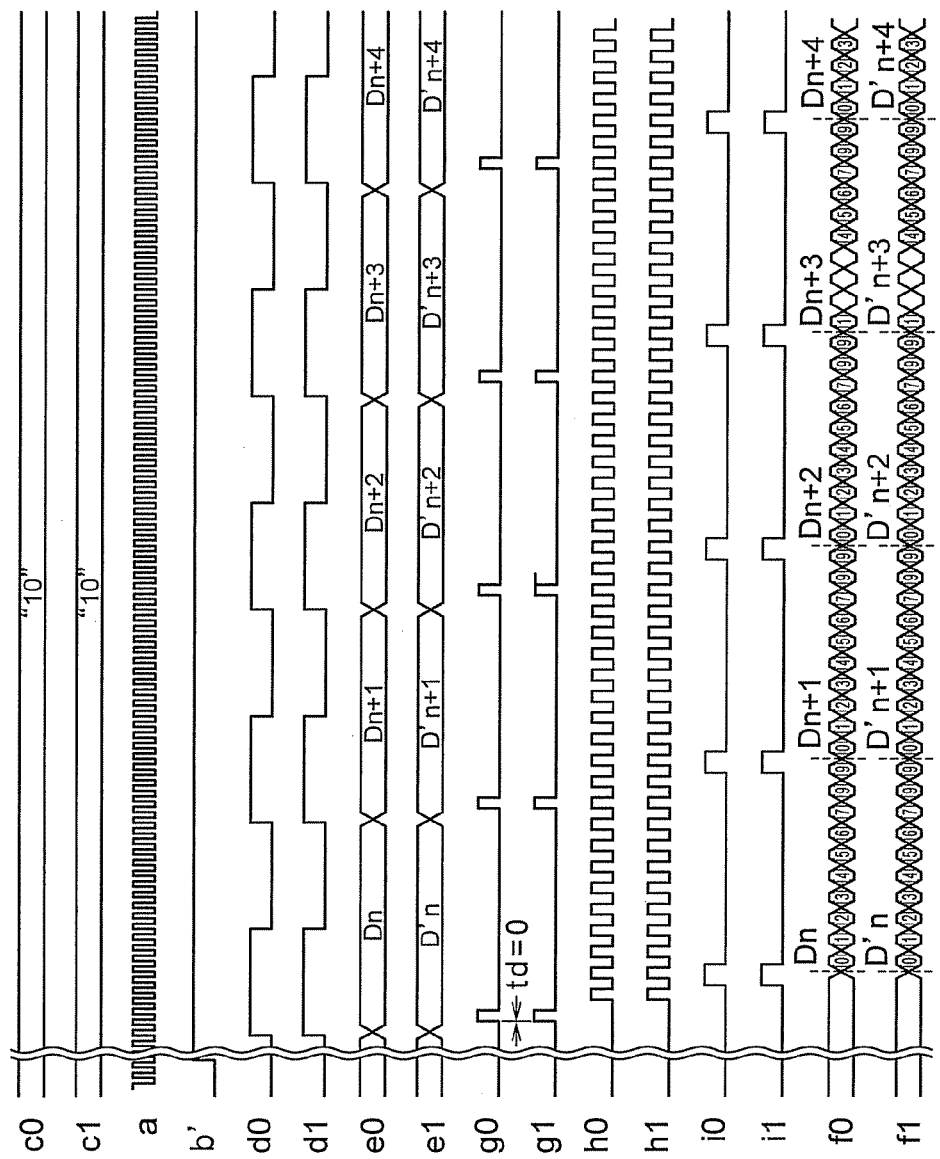
FIG. 6 is a timing diagram of the parallel-serial converter circuit 1 of FIG. 1.

In the case of FIG. 6, the transfer speed control code c0 is "10", and thus the signal transmitter 2 of Lane 0 operates similarly to FIG. 4. Since the transfer speed control code c1 is also "10", the first MUX 8 of Lane 1 selects the frequency-divided signal generated by the frequency divider 11 of Lane 0.

Also in the case of FIG. 6, the timing pulse generators 5 of Lanes 0 and 1 generate the timing pulse signals g0 and g1 in synchronization with the same frequency-divided signal. Thus, no gap is generated between the timing pulse signals of Lanes 0 and 1.

Further, the second MUX 9 and third MUX 10 in Lane 0 select the same initial values as those selected by the second MUX 9 and third MUX 10 in Lane 1. Thus, the first 4-bit PISOs 6 generate the bit clock signals h0 and h1 having the same timing, and the second 4-bit PISOs 7 generate the load signals i0 and i1 having the same timing.

Accordingly, the serial data j0 and j1 generated by the 10-bit PISOs 3 have the same timing, and the serial data f0 and f1 outputted through the buffers 4 have the same timing.

As clearly shown in FIGS. 3 to 6, in the present embodiment, each time the timing pulse signal g0/g1 is outputted, the first/second 4-bit PISO 6/7 loads a corresponding initial value and performs bit shift operation. Therefore, even when a gap is generated between the 10-bit PISOs 3 of Lanes 0 and 1 in the bit shift operation, the gap can be eliminated when the next timing pulse signal is outputted.

Figure 7:
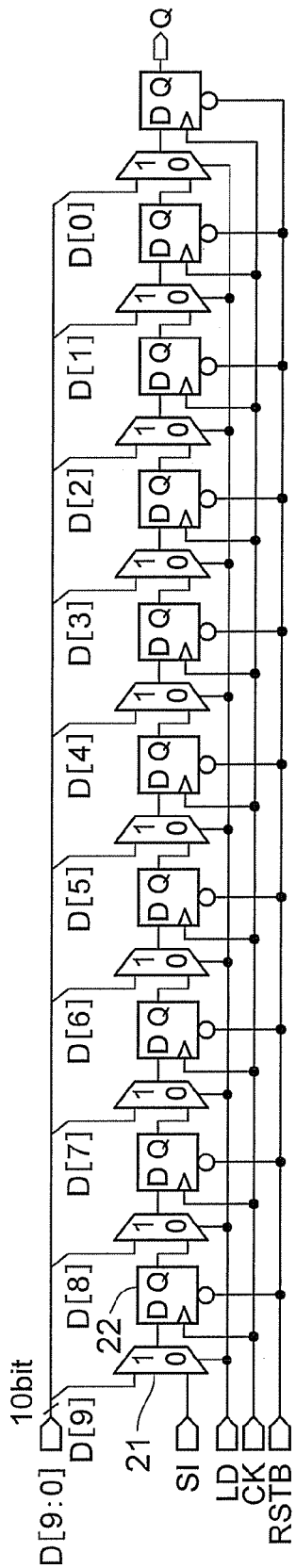
FIG. 7 is a circuit diagram showing an example of the internal configuration of a 10-bit PISO 3 of FIG. 1.

FIG. 7 is a circuit diagram showing an example of the internal configuration of the 10-bit PISO 3 of FIG. 1. The 10-bit PISO 3 of FIG. 7 has 10 multiplexers 21 and 10 D flip-flops 22 alternately connected in cascade. Note that the number of stages to be connected in cascade may be arbitrarily changed.

Each multiplexer 21 selects either the parallel data or bit shift data. The data selected by each multiplexer 21 is loaded to the D flip-flop 22 located in the next stage. Each D flip-flop 22 loads the signal selected by the multiplexers 21 located in the previous stage, in synchronization with a bit clock signal CK generated by the first 4-bit PISO 6.

Each multiplexer 21 selects parallel data D[9:0] in synchronization with the input timing of a load signal LD, and selects the bit shift data while the load signal LD is Low. Note that the multiplexers 21 in the first stage is inputted with SI terminal data instead of the bit shift data. In the present embodiment, the SI terminal is set to Low level.

Figure 8:
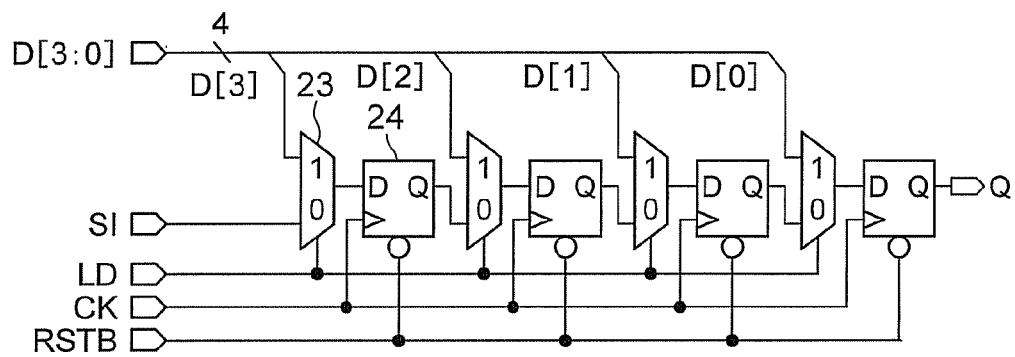
FIG. 8 is a circuit diagram showing an example of the internal configuration of a first 4-bit PISO 6 and a second 4-bit PISO 7.

FIG. 8 is a circuit diagram showing an example of the internal configuration of the first 4-bit PISO 6 and the second 4-bit PISO 7. The circuit of FIG. 8 consists of four multiplexers 23 and four D flip-flops 24 alternately connected in cascade. Note that the number of stages to be connected in cascade may be arbitrarily changed.

Each multiplexer 23 selects either the initial value D[3:0] or bit shift data. More concretely, each multiplexer 23 selects the initial value D[3:0] while the load signal LD is High, and selects the bit shift data while the load signal LD is Low.

Note that the multiplexers 23 in the first stage is inputted with SI terminal data instead of the bit shift data. Since the output data from the first 4-bit PISO 6 is fed back to the SI terminal of the first 4-bit PISO 6, the first 4-bit PISO 6 repeatedly outputs the 4-bit data shown as the initial value D[3:0]. On the other hand, the SI terminal of the second 4-bit PISO 7 is fixed to Low.

Figure 9:
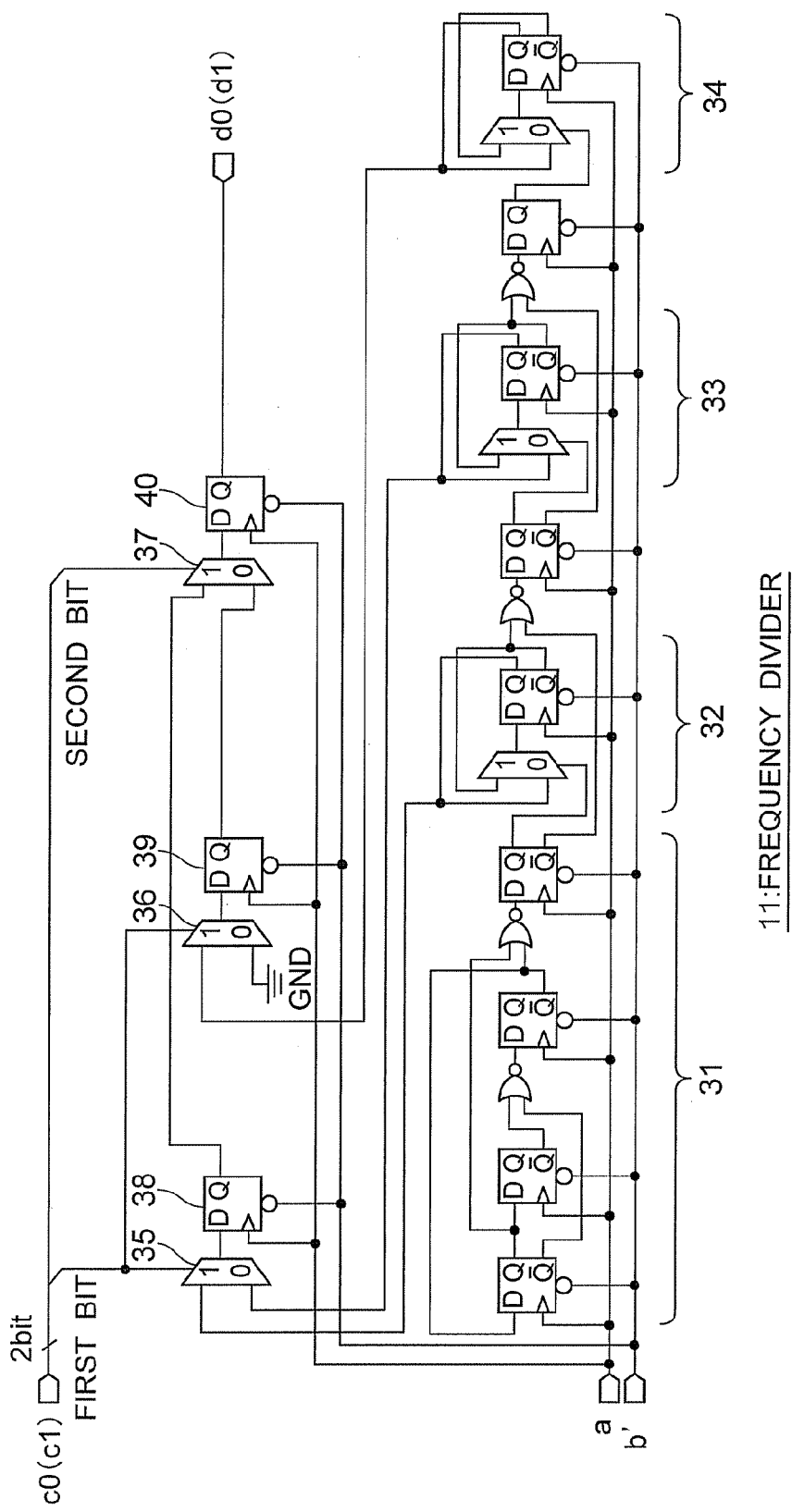
FIG. 9 is a circuit diagram showing an example of the internal configuration of a frequency divider 11 of FIG. 1.

FIG. 9 is a circuit diagram showing an example of the internal configuration of the frequency divider 11 of FIG. 1. The frequency divider 11 of FIG. 9 can switch the dividing ratio between 20 and 40. The dividing ratio is switched by the transfer speed control code c0/c1.

The frequency divider 11 of FIG. 9 has five frequency dividing circuits 31 and three 1/2 frequency dividing circuits 32 to 34 connected in cascade, and can divide the frequency of the high-speed clock signal "a" by 40 (=5×2×2×2). Further, the frequency divider 11 of FIG. 9 has three multiplexers 35 to 37 and three D flip-flops 38 to 40. Based on the value of the least significant bit (zero bit) of the transfer speed control code c0/c1, the multiplexer 35 selects and outputs either the 1/10 frequency-divided signal outputted from the frequency dividing circuit 32 or the 1/20 frequency-divided signal outputted from the frequency dividing circuit 33. Based on the value of the least significant bit of the transfer speed control code c0/c1, the multiplexer 36 selects and outputs either the 1/40 frequency-divided signal outputted from the frequency dividing circuit 34 or the signal fixed to Low. Based on the value of the most significant bit of the transfer speed control code c0/c1, the multiplexer 37 selects and outputs either the signal selected by the multiplexer 35 or the signal selected by the multiplexer 36.

As stated above, the frequency divider 11 of FIG. 9, as a circuit itself, can switch between three patterns: 1/10 dividing ratio, 1/20 dividing ratio, and 1/40 dividing ratio. In the present embodiment, the transfer speed control code c0/c1 has only two types of values ("01" and "10"), which means that 1/40 dividing ratio is selected when the code is 01, and 1/20 dividing ratio is selected when the code is "10".

Figure 10:
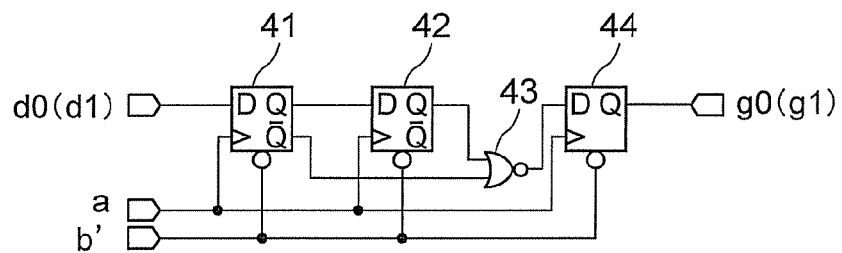
FIG. 10 is a circuit diagram showing an example of the internal configuration of a timing pulse generator 5 of FIG. 1.

FIG. 10 is a circuit diagram showing an example of the internal configuration of the timing pulse generator 5 of FIG. 1. The timing pulse generator 5 of FIG. 10 has two D flip-flops 41 and 42 connected in cascade, a NOR circuit 43 which generates an inverted signal of the logical sum of Q output data from the D flip-flop 42 in the latter stage and /Q output data from the D flip-flop 41 in the former stage, and a D flip-flop 44 which loads the output signal from the NOR circuit 43.

The timing pulse generator 5 of FIG. 10 synchronizes the parallel data synchronous clock signal d0/d1 inputted into the D terminal of the D flip-flop 41 in the first stage with the high-speed clock signal "a", and generates a timing pulse signal corresponding to one cycle of the high-speed clock signal "a", using the rising edge of the parallel data synchronous clock signal d0/d1 as a trigger.

Figure 11:
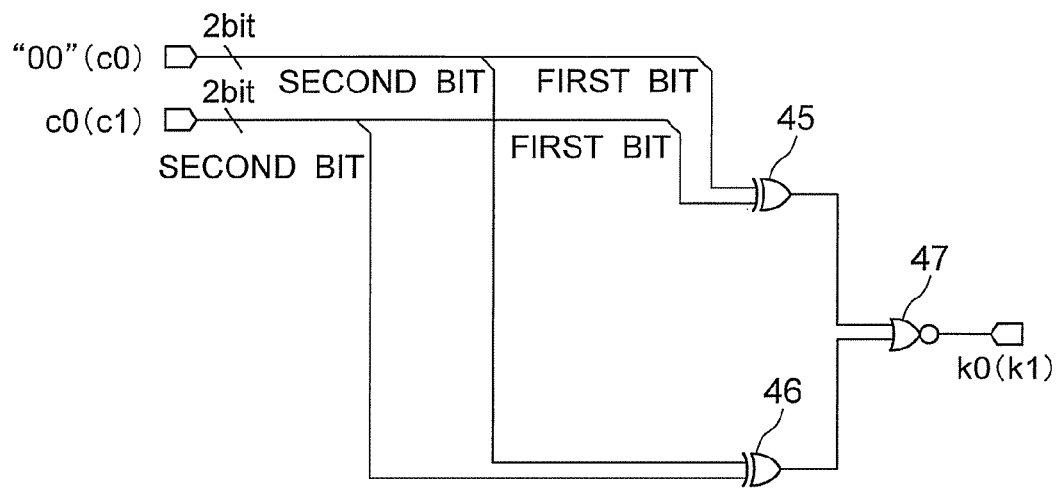
FIG. 11 is a circuit diagram showing an example of the internal configuration of a comparison circuit 12 of FIG. 1.

FIG. 11 is a circuit diagram showing an example of the internal configuration of the comparison circuit 12 of FIG. 1. The comparison circuit 12 of FIG. 11 has two XOR circuits 45 and 46 and a NOR circuit 47. The XOR circuit 45 calculates an exclusive OR between the least significant bits of the transfer speed control codes c0 and c1. The XOR circuit 46 calculates an exclusive OR between the most significant bits of the transfer speed control codes c0 and c1. The NOR circuit 47 outputs an inverted signal of the logical sum of the output signals from the two XOR circuits.

Each of FIGS. 7 to 11 shows a circuit example, and concrete circuit configuration can be variously changed.

As stated above, in the present embodiment, when the same transfer speed control code is inputted into a plurality of lanes, the slave lane selects the frequency-divided signal of the master lane to generate the timing pulse signals g0 and g1, which makes it possible to eliminate a timing gap between the timing pulse signals g0 and g1 of the master lane and slave lane. Accordingly, no timing gap is generated between the load signals i0 and i1 and between the bit clock signals h0 and h1 generated in synchronization with the timing pulse signals g0 and g1 in the master lane and slave lane. Thus, no timing gap is generated between the serial data j0 and j1 outputted from the 10-bit PISOs 3 which performs parallel-serial conversion in synchronization with the load signals i0 and i1 and the bit clock signals h0 and h1.

Thus, the present embodiment makes it possible to perform parallel-serial conversion without being influenced by a reset timing gap due to a difference in the load capacity of the reset signal path.

In the present embodiment, each time the timing pulse signal is inputted, the first 4-bit PISO 6 and the second 4-bit PISO 7 restart generating the bit clock signal h0/h1 and the load signal i0/i1 respectively. Thus, even when a timing gap is generated between the bit clock signals h0 and h1 or between the load signals i0 and i1 in Lanes 0 and 1 for any reason, the gap can be eliminated at the point when the next timing pulse signal is inputted. Therefore, parallel-serial conversion in Lane 0 and parallel-serial conversion in Lane 1 can be stably synchronized with each other without depending on the reset signal.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A parallel-serial converter circuit comprising:
   a frequency divider configured to generate a frequency-divided signal by dividing a frequency of a reference clock signal by a dividing ratio depending on a logic of a speed control signal;
   a timing pulse generator configured to generate a timing pulse signal based on the frequency-divided signal;
   a load signal generator configured to generate a load signal based on the speed control signal and the timing pulse signal;
   a bit clock generator configured to generate a bit clock signal based on the speed control signal and the timing pulse signal; and
   a parallel-serial converter configured to newly load the parallel data in synchronization with the load signal and convert the loaded parallel data into serial data in synchronization with the bit clock signal.

2. The parallel-serial converter circuit of claim 1,
   wherein the bit clock generator comprises:
   a first selector configured to select one from a plurality of first reference bit strings based on the logic of the speed control signal and set the selected first reference bit string as a first initial value; and
   a first shift register configured to generate the bit clock signal by shifting the bits of the first initial value in synchronization with the reference clock signal, using the timing pulse signal as a trigger.

3. The parallel-serial converter circuit of claim 2,
   wherein the first shift register loads the first initial value each time the timing pulse signal is inputted, and shifts the bits of the first initial value in synchronization with the reference clock signal to generate the bit clock signal.

4. The parallel-serial converter circuit of claim 1,
   wherein the load signal generator comprises:
   a second selector configured to select one from a plurality of second reference bit strings based on the logic of the speed control signal and set the selected second reference bit string as a second initial value; and
   a second shift register configured to generate the load signal by shifting the bits of the second initial value in synchronization with the reference clock signal, using the timing pulse signal as a trigger.

5. The parallel-serial converter circuit of claim 4,
   wherein the load signal generator loads the second initial value each time the timing pulse signal is generated, and shifts the bits of the second initial value in synchronization with the reference clock signal to generate the load signal.

6. The parallel-serial converter circuit of claim 1,
   wherein the speed control signal is a bit string signal including a first bit for defining timing of the load signal and the bit clock signal and a second bit for setting the dividing ratio of the frequency divider.

7. The parallel-serial converter circuit of claim 1,
   wherein the parallel-serial converter circuit comprises n signal transmitters, where n is an integer of 2 or greater, each comprising the frequency divider, the timing pulse generator, the load signal generator, the bit clock generator, and the parallel-serial converter,
   one of the n signal transmitters is a master signal transmitter and each of the others is a slave signal transmitter, and
   the timing pulse generator in the slave signal transmitter inputted with the speed control signal having a logic identical to the logic of the speed control signal inputted into the master signal transmitter generates the timing pulse signal based on the frequency-divided signal generated by the frequency divider in the master signal transmitter.

8. The parallel-serial converter circuit of claim 7,
   wherein when the master signal transmitter and the slave signal transmitter are inputted with the speed control signals having an identical logic, the timing pulse generator in the master signal transmitter and the timing pulse generator in the slave signal transmitter generate the timing pulse signals having an identical timing.

9. The parallel-serial converter circuit of claim 7,
   wherein the slave signal transmitter comprises:
   a slave comparator configured to compare the logic of the speed control signal inputted into the corresponding slave signal transmitter with the logic of the speed control signal inputted into the master signal transmitter to determine whether these logics match each other; and a slave frequency-divided signal selector configured to select, based on the comparison result of the slave comparator, either the frequency-divided signal generated by the frequency divider in the corresponding slave signal transmitter or the frequency-divided signal generated by the frequency divider in the master signal transmitter, and the timing pulse generator in the corresponding slave signal transmitter generates the corresponding timing pulse signal based on the frequency-divided signal selected by the slave frequency-divided signal selector.

10. The parallel-serial converter circuit of claim 9, wherein when the slave comparator detects a match, the slave frequency-divided signal selector selects the frequency-divided signal generated by the frequency divider in the master signal transmitter, and when the slave comparator detects a mismatch, the slave frequency-divided signal selector selects the frequency-divided signal generated by the frequency divider in the corresponding slave signal transmitter.

11. The parallel-serial converter circuit of claim 7, wherein the master signal transmitter comprises:
a master comparator configured to compare the logic of the speed control signal inputted into the corresponding master signal transmitter with a predetermined signal logic to determine whether these match each other; and
a master frequency-divided signal selector configured to select the frequency-divided signal generated by the frequency divider in the master signal transmitter when the master comparator detects a mismatch, and select a signal at a fixed signal level when the master comparator detects a match,
wherein when the master frequency-divided signal selector selects the frequency-divided signal, the timing pulse generator in the master signal transmitter generates the corresponding timing pulse signal, and when the master frequency-divided signal selector selects the signal at the fixed signal level, the timing pulse generator in the master signal transmitter stops generating the timing pulse signal.

12. A parallel-serial converter circuit comprising:
a master signal transmitter; and
n slave signal transmitters, where n is an integer of 1 or greater,
wherein the master signal transmitter comprises:
a first frequency divider configured to generate a first frequency-divided signal by dividing a frequency of a reference clock signal by a dividing ratio depending on a logic of a first speed control signal;
a first timing pulse generator configured to generate a first timing pulse signal based on the first frequency-divided signal;
a first load signal generator configured to generate a first load signal based on the first speed control signal and the first timing pulse signal;
a first bit clock generator configured to generate a first bit clock signal based on the first speed control signal and the first timing pulse signal; and
a first parallel-serial converter configured to newly load the parallel data in synchronization with the first load signal and convert the loaded parallel data into serial data in synchronization with the first bit clock signal,
each of the n slave signal transmitters comprises:

a second frequency divider configured to generate a second frequency-divided signal by dividing a frequency of a reference clock signal by a dividing ratio depending on a logic of a second speed control signal;
a second timing pulse generator configured to generate a second timing pulse signal based on the second frequency-divided signal;
a second load signal generator configured to generate a second load signal based on the second speed control signal and the second timing pulse signal;
a second bit clock generator configured to generate a second bit clock signal based on the second speed control signal and the second timing pulse signal; and
a second parallel-serial converter configured to newly load the parallel data in synchronization with the second load signal and convert the loaded parallel data into serial data in synchronization with the second bit clock signal, and
when the first speed control signal and the second speed control signal have an identical signal logic, the second timing pulse generator generates the timing pulse signal based on the first frequency-divided signal.

13. The parallel-serial converter circuit of claim 12, wherein the master signal transmitter comprises:
a first comparator configured to compare the logic of the first speed control signal inputted into the corresponding master signal transmitter with a predetermined signal logic to determine whether these logics match each other; and
a first frequency-divided signal selector configured to select the first frequency-divided signal generated by the first frequency divider when the first comparator detects a mismatch, and select a signal at a fixed signal level when the first comparator detects a match, and
when the first frequency-divided signal selector selects the first frequency-divided signal, the first timing pulse generator generates the corresponding first timing pulse signal, and when the first frequency-divided signal selector selects the signal at the fixed signal level, the first timing pulse generator stops generating the first timing pulse signal.

14. The parallel-serial converter circuit of claim 12, wherein each of the n slave signal transmitters comprises:
a second comparator configured to compare the logic of the second speed control signal inputted into the corresponding slave signal transmitter with the logic of the first speed control signal inputted into the master signal transmitter to determine whether these logics match each other; and
a second frequency-divided signal selector configured to select, based on the comparison result of the second comparator, either the second frequency-divided signal generated by the second frequency divider in the corresponding slave signal transmitter or the first frequency-divided signal generated by the first frequency divider in the master signal transmitter, and
the second timing pulse generator in the corresponding slave signal transmitter generates the corresponding second timing pulse signal based on the frequency-divided signal selected by the second frequency-divided signal selector.

15. The parallel-serial converter circuit of claim 14, wherein when the second comparator detects a match, the slave frequency-divided signal selector selects the frequency-divided signal generated by the first frequency divider in the master signal transmitter, and when the second comparator detects a mismatch, the slave frequency-divided signal selector selects the second frequency-divided signal generated by the second frequency divider in the corresponding slave signal transmitter.

16. The parallel-serial converter circuit of claim 12,
wherein the first bit clock generator comprises:
a first selector configured to select one from a plurality of first reference bit strings based on the logic of the first speed control signal and set the selected first reference bit string as a first initial value; and
a first shift register configured to generate the first bit clock signal by shifting the bits of the first initial value in synchronization with the reference clock signal, using the first timing pulse signal as a trigger, and
the second bit clock generator comprises:
a second selector configured to select one from a plurality of first reference bit strings based on the logic of the second speed control signal and set the selected first reference bit string as a first initial value; and
a second shift register configured to generate the second bit clock signal by shifting the bits of the first initial value in synchronization with the reference clock signal, using the second timing pulse signal as a trigger.

17. The parallel-serial converter circuit of claim 16,
wherein the first shift register loads the first initial value each time the first timing pulse signal is inputted, and shifts the bits of the first initial value in synchronization with the reference clock signal to generate the first bit clock signal, and
the second shift register loads the first initial value each time the second timing pulse signal is inputted, and shifts the bits of the first initial value in synchronization with the reference clock signal to generate the second bit clock signal.

18. The parallel-serial converter circuit of claim 12,
wherein the first load signal generator comprises:
a third selector configured to select one from a plurality of second reference bit strings based on the logic of the first speed control signal and set the selected second reference bit string as a second initial value; and
a third shift register configured to generate the load signal by shifting the bits of the second initial value in synchronization with the reference clock signal, using the first timing pulse signal as a trigger, and
the second load signal generator comprises:
a fourth selector configured to select one from a plurality of second reference bit strings based on the logic of the second speed control signal and set the selected second reference bit string as a second initial value; and
a fourth shift register configured to generate the load signal by shifting the bits of the second initial value in synchronization with the reference clock signal, using the second timing pulse signal as a trigger.

19. The parallel-serial converter circuit of claim 18,
wherein the first load signal generator loads the second initial value each time the first timing pulse signal is generated, and shifts the bits of the second initial value in synchronization with the reference clock signal to generate the load signal, and
the second load signal generator loads the second initial value each time the second timing pulse signal is generated, and shifts the bits of the second initial value in synchronization with the reference clock signal to generate the load signal.

20. The parallel-serial converter circuit of claim 12,
wherein the first speed control signal is a bit string signal including a first bit for defining timing of the first load signal and the first bit clock signal and a second bit for setting the dividing ratio of the frequency divider, and
the second speed control signal is a bit string signal including a first bit for defining timing of the second load signal and the second bit clock signal and a second bit for setting the dividing ratio of the frequency divider.

\* \* \* \* \*